United States Patent
Baek et al.

(10) Patent No.: US 8,796,559 B2
(45) Date of Patent: Aug. 5, 2014

(54) LEAD PIN FOR PRINTED CIRCUIT BOARD AND PRINTED CIRCUIT BOARD USING THE SAME

(75) Inventors: Yong Ho Baek, Gyeongsangnam-do (KR); Seok Hyun Park, Gyeongsangnam-do (KR); Ki Taek Lee, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 382 days.

(21) Appl. No.: 12/987,668

(22) Filed: Jan. 10, 2011

(65) Prior Publication Data

US 2012/0118620 A1 May 17, 2012

(30) Foreign Application Priority Data

Nov. 17, 2010 (KR) ........................ 10-2010-0114627

(51) Int. Cl.
*H05K 1/11* (2006.01)
*H01B 5/00* (2006.01)

(52) U.S. Cl.
USPC ......... 174/267; 174/126.1; 174/257; 439/876

(58) Field of Classification Search
CPC ............................................... H01L 23/49811
USPC ..................... 174/257; 439/83, 876
See application file for complete search history.

(56) References Cited

U.S. PATENT DOCUMENTS

| | | | | |
|---|---|---|---|---|
| 6,359,332 B2* | 3/2002 | Shiraishi | ....................... | 257/697 |
| 6,623,283 B1* | 9/2003 | Torigian et al. | ................. | 439/83 |
| 7,723,620 B2* | 5/2010 | Kawade et al. | ............... | 174/267 |
| 7,893,355 B2* | 2/2011 | Oh et al. | ..................... | 174/94 R |
| 8,142,240 B2* | 3/2012 | Oh et al. | ..................... | 439/876 |
| 2010/0139970 A1* | 6/2010 | Oshima et al. | ................ | 174/267 |

FOREIGN PATENT DOCUMENTS

JP     2001217342 A  *  8/2001

* cited by examiner

*Primary Examiner* — William H Mayo, III
*Assistant Examiner* — Hiram E Gonzalez
(74) *Attorney, Agent, or Firm* — Ladas & Parry, LLP

(57) ABSTRACT

Disclosed herein are a lead pin for a printed circuit board and a printed circuit board using the same. The lead pin for a printed circuit board includes: a connection pin; and a pin head part formed at one end portion of the connection pin and including a protrusion, the diameter thereof being formed to be increasingly small based on a surface contacting the connection pin and the outer peripheral surface thereof being provided with a protrusion-shaped or depression-shaped band, whereby it forms a protrusion-shaped band or a depression-shaped band on the pin head part of the lead pin to increase a contacting area with the solder, thereby improving an adhesion between the lead pin and the printed circuit board.

8 Claims, 3 Drawing Sheets

LEAD PIN FOR PRINTED CIRCUIT BOARD AND PRINTED CIRCUIT BOARD USING THE SAME

CROSS REFERENCE TO RELATED APPLICATION

This application claims the benefit of Korean Patent Application No. 10-2010-0114627, filed on Nov. 17, 2010, entitled "Lead Pin For Printed Circuit Board And Printed Circuit Board Using The Same", which is hereby incorporated by reference in its entirety into this application.

BACKGROUND OF THE INVENTION

1. Technical Field

The present invention relates to a lead pin for a printed circuit board and a printed circuit board using the same.

2. Description of the Related Art

In a PGA substrate, when a T-type lead pin is bonded to a pad on a package substrate by using an Sn95-Sb5 solder (melting point of 232 to 240° C.) having a melting point higher than that of an Sn96-Ag3.5-X based solder (melting point of 221° C. used when bonding IC chips.

The above-mentioned process is essential to prevent the pin from being separated when the IC chips are mounted on the package substrate. Generally, in order to minimize thermal impact applied to the package substrate, the above-mentioned process shortens the time when a soldering is maintained at a temperature of a melting point or more, such that the time of discharging bubbles in the soldering is insufficient. In this case, the soldering are in a non-uniform distribution state to cause a problem of biasing the lead pin due to a tension with the lead pin, thereby making it possible to degrade the pin pull strength.

Further, even though the above-mentioned bubbles do not cause any problems during the bonding of the lead pin, the IC chips are again heated during the mounting process of the IC chips, such that they can cause the defects of the pin.

SUMMARY OF THE INVENTION

The present invention has been made in an effort to improve an adhesion between a lead pin and a printed circuit board by increasing a contacting area between a lead pin and a solder.

Further, the present invention has been made in an effort to form a depression-shaped band or a protrusion-shaped band at a pin head part, forming roughness, pin pull strength between a lead pin and a printed circuit board, and suppressing interface defects between a solder and a pin head part.

According to a preferred embodiment of the present invention, there is provided a lead pin for a printed circuit board, including: a connection pin; and a pin head part formed at one end portion of the connection pin and including a protrusion, the diameter thereof being formed to be increasingly small based on a surface contacting the connection pin and the outer peripheral surface thereof being provided with a protrusion-shaped or depression-shaped band.

The protrusion may include a first protrusion having a reverse step shape having a stepped structure of which the diameter is small stepwise based on a surface contacting the connection pin.

The protrusion may further include a second protrusion formed on the first protrusion in a semispherical shape.

The protrusion may be disposed on a surface contacting the connection pin and the outer peripheral surface thereof may be provided with a groove having a band shape.

The protrusion may be provided with a semi-sphere formed on a surface contacting the connection pin and a groove having a circular band shape formed at the outer peripheral surface of the semi-sphere in a vertical direction to the connection pin, and the diameter of the circular band may be small stepwise based on a surface contacting the connection pin.

The connection pin may be any one of a polygonal column and a cylinder and a combination thereof.

The pin head part may further include a head having a plate shape that is formed at one end portion of the connection pin and is disposed between the connection pin and the protrusion.

The head may be any one of a polygonal shape and a circular shape and a combination thereof.

The outer peripheral surface of the pin head part of the lead pin may be formed with roughness.

According to another preferred embodiment of the present invention, there is provided a printed circuit board, including: a base substrate having a connection pad exposed through an opening of a solder resist layer; a lead pin including a connection pin and a pin head part formed at one end portion of the connection pin and including a protrusion, the diameter thereof being formed to be increasingly small based on a surface contacting the connection pin and the outer peripheral surface thereof being provided with a protrusion-shaped or depression-shaped band; and a solder bonding the pin head part of the lead pin on a connection pad of the base substrate.

The protrusion may include a first protrusion having a reverse step shape having a stepped structure of which the diameter is small stepwise based on a surface contacting the connection pin.

The protrusion may further include a second protrusion formed on the first protrusion in a semispherical shape.

The protrusion may be disposed on a surface contacting the connection pin and the outer peripheral surface thereof may be provided with a groove having a band shape.

The protrusion may be provided with a semi-sphere formed on a surface contacting the connection pin and a groove having a circular band shape formed at the outer peripheral surface of the semi-sphere in a vertical direction to the connection pin, and the diameter of the circular band may be small stepwise based on a surface contacting the connection pin.

The connection pin may be any one of a polygonal column and a cylinder and a combination thereof.

The pin head part may further include a head having a plate shape that is formed at one end portion of the connection pin and is disposed between the connection pin and the protrusion.

The head may be any one of a polygonal shape and a circular shape and a combination thereof.

The outer peripheral surface of the pin head part of the lead pin may be formed with roughness.

DESCRIPTION OF THE PREFERRED EMBODIMENTS

Figure 1:
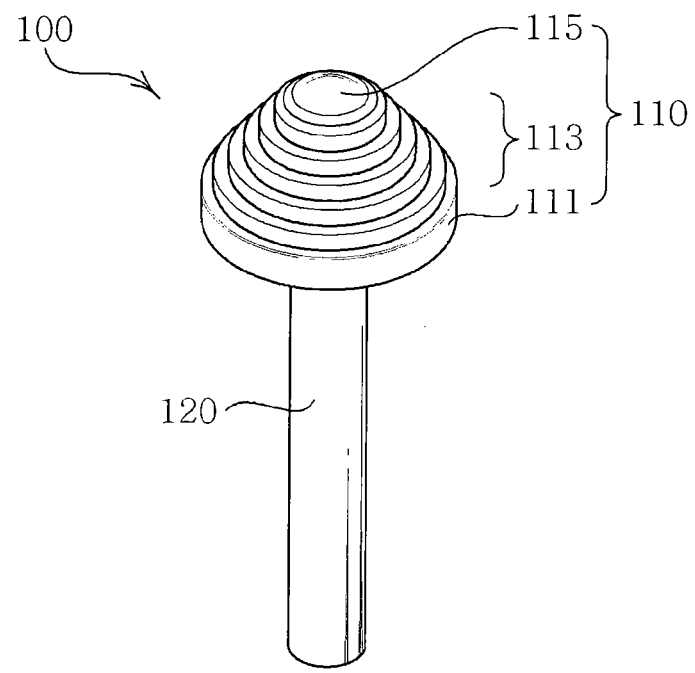
FIG. 1 is a perspective view showing an example of a lead fin for a printed circuit board according to the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", "one surface", "the other surface" and so on are used to distinguish one element from another element, and the elements are not defined by the above terms.

Hereinafter, preferred embodiments of the present invention will be described in detail with reference to the accompanying drawings.

Lead Pin for Printed Circuit Board

FIG. 1 is a perspective view showing an example of a lead fin for a printed circuit board according to the present invention. A lead pin for a printed circuit board will be described with reference to a front view of FIG. 2.

As shown, a lead pin 100 for a printed circuit board may include a connection pin 120 and a pin head part 110 vertically arranged on the connection pin 120.

Described in more detail, the pin head part 110 is formed at one end portion of the connection pin 120 and may include protrusions 113 and 115, wherein the diameter thereof is formed to be increasingly small based on a surface contacting the connection pin 120 and the outer peripheral surface thereof has a protrusion-shaped or depression-shaped band.

For example, as shown in FIG. 1, the outer peripheral surfaces of the protrusions having a protrusion-shaped band provided at the pin head part 110 are provided with a plurality of protrusion-shaped bands and the diameter thereof is formed to be small stepwise based on a surface contacting the connection pin 120.

In this configuration, the diameter of the protrusion may include a first protrusion 113 having a reverse step shape having a step structure formed to be small stepwise based on a surface contacting the connection pin 120.

Further, since the first protrusion 113 is formed to have a reverse step shape, the contacting area with the solder to be described below is increased, such that the adhesion between the lead pin 100 and the solder (or printed circuit board) can be improved.

In addition, the protrusion may further include a second protrusion 115 that is formed on the first protrusion 113 in a semispherical shape.

In other words, the protrusion may include only the first protrusion 113, but may further include the second protrusion 115.

The connection pin 120 may be any one of a polygonal column such as a triangular column and a quadrangular column and a cylinder and a combination thereof.

The pin head part 110 may further include a head 111 having a plate shape that is formed at one end portion of the connection pin 120 and is arranged between the connection pin 120 and the protrusion.

In this configuration, the head 111 may be any one of a polygonal shape such as a triangular shape and a quadrangular shape and a circular shape and a combination thereof.

For example, as shown in FIG. 1, the head 111 is arranged in a shape contacting the first protrusion 113 and may be a disc shape, but is not limited thereto.

In addition, the diameter of the head 111 is larger than that of the protrusions 113 and 115. The structure may obtain an effect of preventing a climbing phenomenon that a solder climbs along the surface of the connection pin 120.

On the other hand, the outer peripheral surface of the pin head part 110 of the lead pin 100 may be formed with roughness, such that the pin pull strength with the solder to be described below can be improved.

Figure 3:
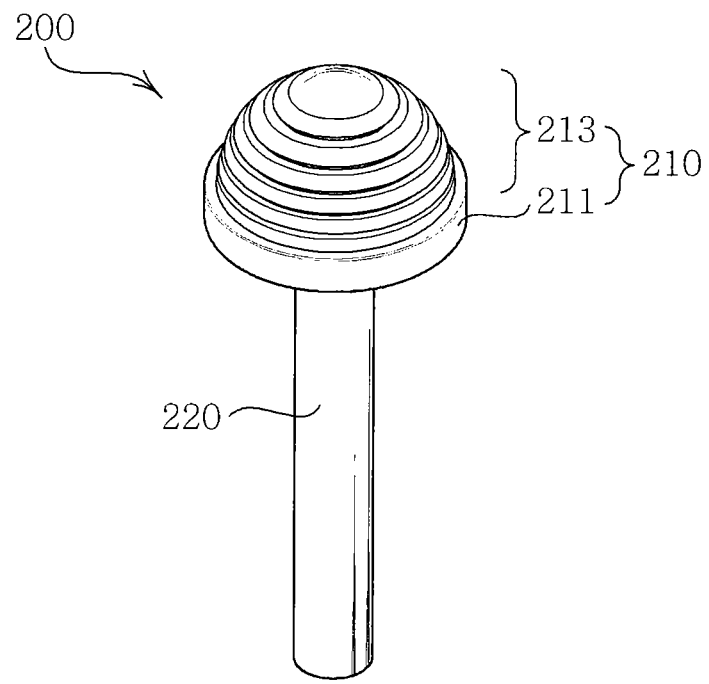
FIG. 3 is a perspective view showing another example of a lead fin for a printed circuit board according to the present invention.

FIG. 3 is a perspective view showing another example of a lead fin for a printed circuit board according to the present invention. A lead pin will be described with reference to a front view of FIG. 4

As shown, a lead pin 200 for a printed circuit board may include a connection pin 220 and a pin head part 210 vertically arranged on the connection pin 220.

Described in more detail, the connection pin 220 may be any one of a polygonal column (for example, a polygonal column such as a triangular column and a quadrangular column) and a cylinder and a combination thereof.

The pin head part 210 is formed at one end portion of the connection pin 220 and the diameter thereof is increasingly small based on a surface contacting the connection pin 220. The outer peripheral surface of the pin head part 210 may be provided with protrusions having a protrusion-shaped or depression-shaped band.

In this configuration, the protrusion is disposed on a surface contacting the connection pin 220 and the outer peripheral surface thereof has grooves 215 having a band shape.

Figure 4:
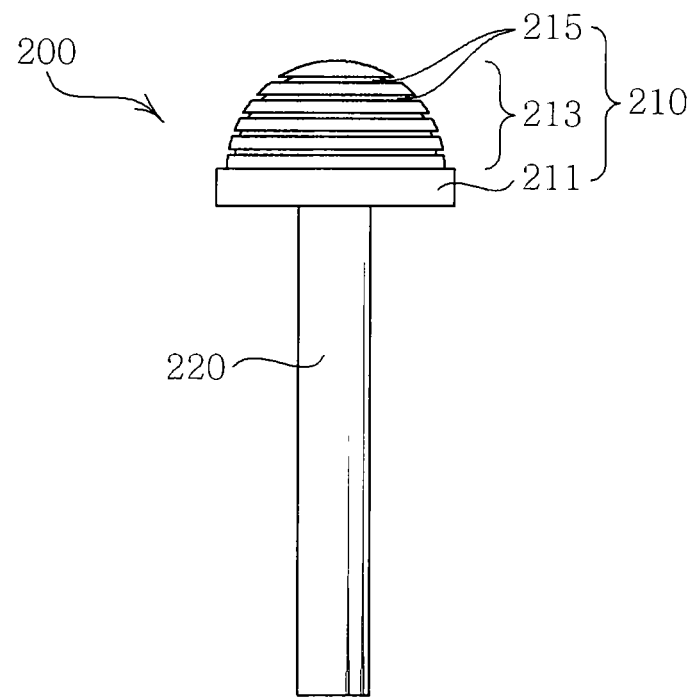
FIG. 4 is a front view of the lead pin for the printed circuit board of FIG. 3.

The outer peripheral surface of the depression-shaped protrusion 213 provided at the pin head part 210 may be provided with a plurality of depression-shaped bands (a groove 215 having a band shape), as shown in FIG. 4. The groove 215 having the band shape provided at the pin head part 210 increases the contacting area with the solder to be described below, such that the pin pull strength between the solder and the pin head part 210 (or a lead pin 200 or a printed circuit board) can be improved. In addition, the depression-shape band or the protrusion-shaped band structurally increases a resistance force against a vertically pulled force to improve the pin pull strength and suppress the interface defects between the solder and the pin head parts 110 and 210.

In addition, the protrusion may include a semi-sphere 213 formed on a surface contacting the connection pin 220 and the groove 215 having a circular band shape formed at the outer peripheral surface of the semi-sphere 213 in a vertical direction to the connection pin 220. In this configuration, the diameter of the circular band may be a shape to be small stepwise according to the shape of the semi-sphere 213 based on a surface contacting the connection pin 220.

The pin head part 210 may further include a head 211 having a plate shape that is to formed at one end portion of the connection pin 220 and is arranged between the connection pin 220 and the protrusion.

In this configuration, the head 211 may be any one of a polygonal shape such as a triangular shape and a quadrangular shape and a circular shape and a combination thereof.

In addition, the diameter of the head 211 is larger than that of the protrusion (a first protrusion 213 and a second protrusion 215). The structure may obtain an effect of preventing a climbing phenomenon that a solder climbs along the surface of the connection pin 220.

On the other hand, the outer peripheral surface of the pin head part 210 of the lead pin 200 may be formed with roughness, such that the pin pull strength with the solder to be described below can be improved.

On the other hand, the pin head parts 110 and 210 disclosed in FIGS. 1 to 4 may be manufactured through a shape change of a blanking mold during the pin manufacturing process.

Printed Circuit Board Bonded to Lead Pin

The present drawings schematically show the printed circuit board, while omitting other detailed components of the printed circuit board other than feature components according to the preferred embodiments. It can be appreciated from those skilled in the art that the lead pin of the present invention may be applied to all the printed circuit boards known to those skilled in the art without being specifically limited.

Figure 5:
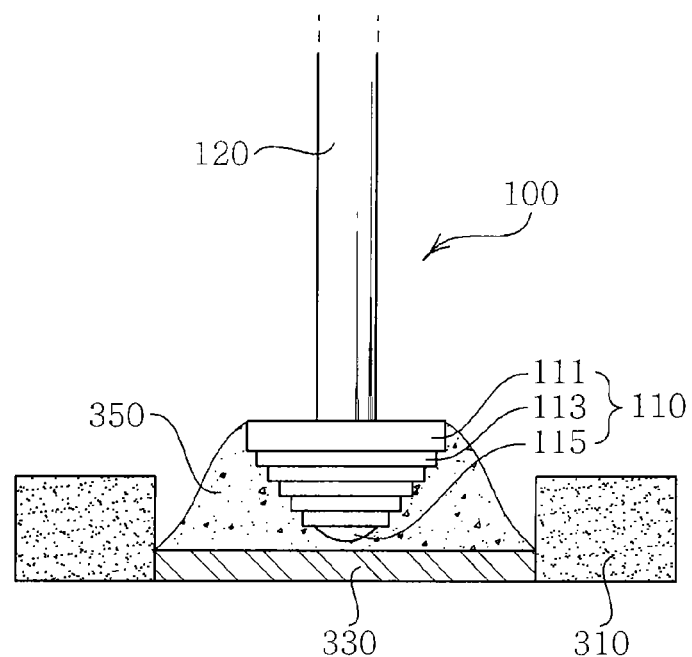
FIG. 5 is a diagram showing an example of a lead fin for a printed circuit board bonded to the lead pin according to the present invention.
Figure 6:
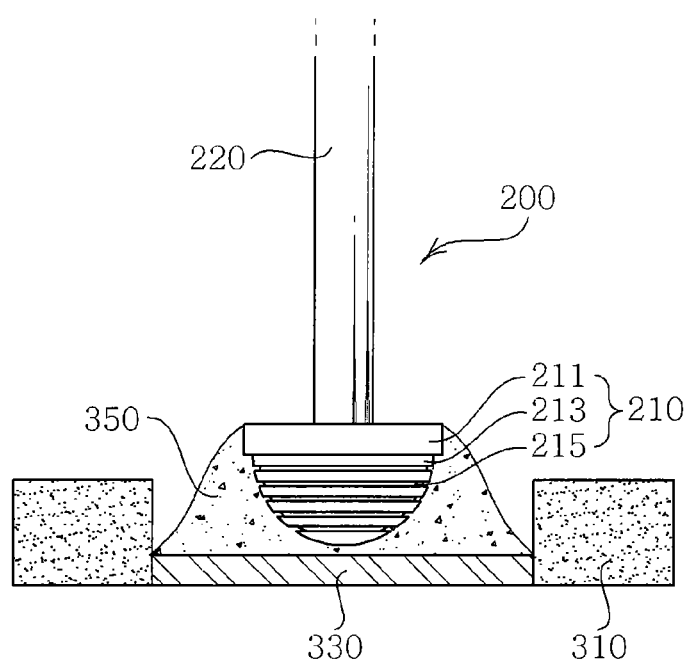
FIG. 6 is a diagram showing another example of a printed circuit board bonded to a lead pin according to the present invention.

FIGS. 5 and 6 are views showing an example of a printed circuit board bonded to a lead pin according to the present invention.

As shown in FIGS. 5 and 6, the printed circuit board bonded to the lead pin may include the base substrate, the lead pins 100 and 200 mounted on the base substrate, and a solder 350 bonding the lead pin to the base substrate.

Described in more detail, the base substrate may have a connection pad 330 exposed through an opening of the solder resist layer 310.

The base substrate may preferably be a printed circuit board as a circuit board in which a circuit of one or more layer including the connection pad 330 is formed on the insulating layer. Even though the present drawings describe that the detailed inner circuit configuration is omitted for convenience of explanation, it can be apparently appreciated from those skilled in the art that a general circuit board formed with a circuit of one or more layer may be applied to the insulating layer as the base substrate.

As the insulating layer, a resin insulating layer may be used. As the resin insulating layer, a thermosetting resin such as an epoxy resin, a thermoplastic resin such as polyimide, or a resin, in which a reinforcement material such as a glass fiber or an inorganic filler is impregnated, such as prepreg may be used. Further, as the resin insulating layer, the thermosetting resin and/or the photocurable resin, or the like, may be used; however, the preferred embodiment is not specifically limited thereto.

A material for a circuit including the connection pad 330 may be used without limitation if a conductive metal for a circuit may be used in the field of the circuit board. Generally, copper is used for the printed circuit board.

The solder resist layer 310 serves as a protective layer protecting an outermost circuit and is formed for electrical insulation and is provided with an opening to expose the connection pad 330 at the outermost layer. As known in those skilled in the art, the solder resist layer 310 may be configured of, for example, solder resist ink, a solder resist film, or an encapsulant, or the like, but is not limited thereto.

The exposed connection pad 330 may be further provided with a surface treatment layer (not shown), if necessary.

The surface treatment layer is not specifically limited thereto if it is known to those skilled in the art. For example, the surface treatment layer may be formed by electro gold plating, immersion gold plating, organic solderability preservative (OSP), immersion tin plating, immersion silver plating, electroless nickel and immersion gold (ENIG), direct immersion gold (DIG) plating, hot air solder leveling (HASL), or the like.

The lead pins 100 and 200 may include the connection pins 120 and 220 and the pin head parts 110 and 210, wherein the pin head parts 110 and 210 are formed at one end portion of the connection pins 120 and 220 and may include protrusions. The diameter of the protrusion is formed to be increasingly small based on a surface contacting the connection pin 210 and 220 and the outer peripheral surface thereof has a protrusion-shaped or depression-shaped band.

Figure 2:
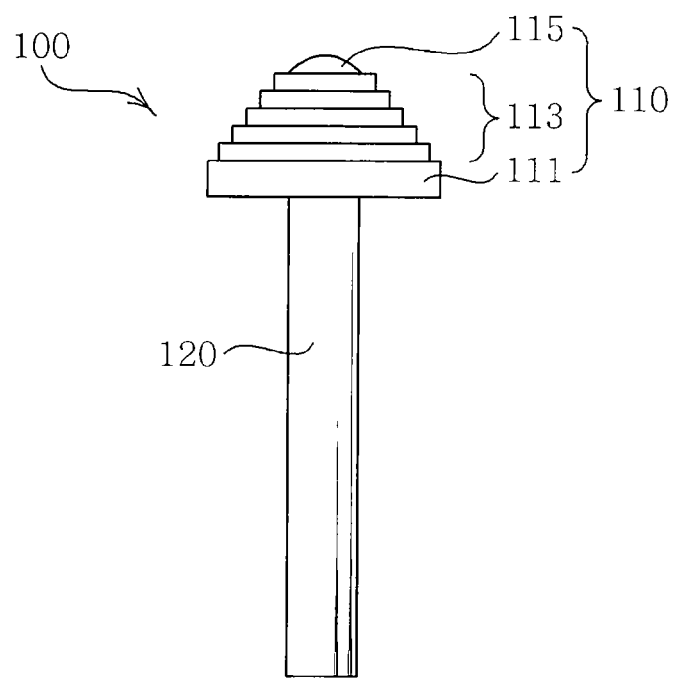
FIG. 2 is a front view of the lead pin for the printed circuit board of FIG. 1.

As shown in FIGS. 1 and 2, the diameter of the protrusion may include the first protrusion 113 having a reverse step shape having a step structure formed to be small stepwise based on a surface contacting the connection pin 120.

In addition, the protrusion may further include a second protrusion 115 that is formed on the first protrusion 113 in a semispherical shape.

On the other hand, as shown in FIGS. 3 and 4, the protrusion is disposed on the surface contacting the connection pin 220 and the outer peripheral surface thereof may be provided with the groove 215 having a band shape.

For example, the protrusion may include a semi-sphere 213 formed on a surface contacting the connection pin 220 and the groove 215 having a circular band shape formed at the outer peripheral surface of the semi-sphere 213 in a vertical direction to the connection pin 220. In this configuration, the diameter of the circular band may be a shape to be small stepwise according to the shape of the semi-sphere 213 based on a surface contacting the connection pin 220.

As described above, the pin head parts 110 and 210 of the present invention are configured to have the protrusion-shaped band (for example, a reverse step shape) or the depression-shaped band and have a structure in which the diameter thereof is increasingly small based on the surface contacting the connection pin, such that the climb phenomenon that the solder paste is climbing along the surface of the connection pins 120 and 220 during the process of mounting the lead pins 100 and 200 on the connection pad 330 can be prevented.

The connection pins 120 and 220 may be formed to have any one column shape of a polygonal shape such as a triangular column and a quadrangular column and a cylinder and a combination thereof.

The pin head parts 110 and 220 may further include the heads 111 and 211 having a plate shape that is formed at one end portion of the connection pins 120 and 220 and is arranged between the connection pins 120 and 220 and the protrusions 113 and 213.

In this configuration, the heads 111 and 211 may be any one of a polygonal shape such as a triangular shape and a quadrangular shape and a circular shape and a combination thereof.

Meanwhile, the outer peripheral surfaces of the pin head parts 110 and 210 of the lead pins 100 and 200 may be provided with roughness.

The solder 350 may bond the pin head parts 110 and 210 of the lead pins 100 and 200 to the connection pad 330 of the base substrate.

In this configuration, the material of the solder 350 is not specifically limited and therefore, may be made of a typical component known to those skilled in the art.

As set forth above, in the lead pin for the printed circuit board and the printed circuit board using the same according to the present invention, the protrusion-shaped or depression-shaped band structure is formed at the pin head part of the lead pin to increase the contacting area with the solder, thereby making it possible to improve the adhesion between the lead pin the printed circuit board.

Further, the present invention forms the depression-shaped or protrusion-shaped band at the pin head part and forms roughness, thereby making it possible to improve the pin pull strength between the lead pin and the printed circuit board and suppress the interface defects between the solder and the pin head part.

Although the preferred embodiments of the present invention have been disclosed for illustrative purposes, they are for specifically explaining the present invention and thus a lead pin for a printed circuit board and a printed circuit board using the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A lead pin for a printed circuit board, comprising:
   a connection pin; and
   a pin head part formed at one end portion of the connection pin and including a protrusion, the diameter thereof being formed to be increasingly small based on a surface contacting the connection pin and the outer peripheral surface thereof being provided with a plurality of depression-shaped bands,
   wherein:
      the plurality of the bands has a stairstep pattern,
      the pin head part further includes a head having a plate shape that is formed at one end portion of the connection pin and is disposed between the connection pin and the protrusion,
      the protrusion is disposed on a surface contacting the head and the outer peripheral surface thereof is provided with a plurality of grooves having a band shape,
      the protrusion is provided with a semi-sphere formed on a surface contacting the head and a plurality of grooves having a circular band shape formed at the outer peripheral surface of the semi-sphere in a vertical direction to the connection pin, and
      the diameter of the circular band is small stepwise based on a surface contacting the connection pin.

2. The lead pin for a printed circuit board as set forth in claim 1, wherein the connection pin is any one of a polygonal column and a cylinder and a combination thereof.

3. The lead pin for a printed circuit board as set forth in claim 1, wherein the head is to any one of a polygonal shape and a circular shape and a combination thereof.

4. The lead pin for a printed circuit board as set forth in claim 1, wherein the outer peripheral surface of the pin head part of the lead pin is formed with roughness.

5. A printed circuit board, comprising:
   a base substrate having a connection pad exposed through an opening of a solder resist layer;
   a lead pin including a connection pin and a pin head part formed at one end portion of the connection pin and including a protrusion, the diameter thereof being formed to be increasingly small based on a surface contacting the connection pin and the outer peripheral surface thereof being provided with a plurality of depression-shaped bands, the plurality of the bands having a stairstep pattern; and
   a solder bonding the pin head part of the lead pin on a connection pad of the base substrate,
   wherein:
      the pin head part further includes a head having a plate shape that is formed at one end portion of the connection pin and is disposed between the connection pin and the protrusion,
      the protrusion is disposed on a surface contacting the head and the outer peripheral surface thereof is provided with a plurality of grooves having a band shape,
      the protrusion is provided with a semi-sphere formed on a surface contacting the head and a plurality of grooves having a circular band shape formed at the outer peripheral surface of the semi-sphere in a vertical direction to the connection pin, and
      the diameter of the circular band is small stepwise based on a surface contacting the connection pin.

6. The printed circuit board as set forth in claim 5, wherein the connection pin is any one of a polygonal column and a cylinder and a combination thereof.

7. The printed circuit board as set forth in claim 5, wherein the head is any one of a polygonal shape and a circular shape and a combination thereof.

8. The printed circuit board as set forth in claim 5, wherein the outer peripheral surface of the pin head part of the lead pin is formed with roughness.

* * * * *